United States Patent
Choi et al.

(10) Patent No.: US 7,372,733 B2
(45) Date of Patent: May 13, 2008

(54) NON-VOLATILE SEMICONDUCTOR MEMORY DEVICE HAVING DIFFERENT ERASE PASS VOLTAGES FOR RESPECTIVE MEMORY SECTORS AND ASSOCIATED ERASE METHOD

(75) Inventors: Jong In Choi, Sungnam-si (KR); Jae Yong Jeong, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/598,788

(22) Filed: Nov. 14, 2006

(65) Prior Publication Data
US 2007/0280003 A1 Dec. 6, 2007

(30) Foreign Application Priority Data
May 23, 2006 (KR) .................. 10-2006-0046181

(51) Int. Cl.
*G11C 16/04* (2006.01)
(52) U.S. Cl. .................. 365/185.11; 365/185.22; 365/185.29; 365/185.3
(58) Field of Classification Search ........... 365/185.11, 365/185.22, 185.29, 185.3, 185.33
See application file for complete search history.

(56) References Cited

U.S. PATENT DOCUMENTS 6,891,752 B1 * 5/2005 Bautista et al. ......... 365/185.11
7,236,406 B2 * 6/2007 Ito et al. .................. 365/185.3

FOREIGN PATENT DOCUMENTS

JP 2005346876 12/2005
KR 1020050108979 11/2005

* cited by examiner

*Primary Examiner*—Connie C. Yoha
(74) *Attorney, Agent, or Firm*—Volentine & Whitt, PLLC

(57) ABSTRACT

A non-volatile semiconductor memory device comprises a plurality of memory sectors arranged in different memory banks having different bulk regions. The memory cells can be erased using a first mode erase operation, which determines different erase pass voltages for the respective memory sectors by successively increasing a bank voltage applied to each sector until the number of failed cells in each sector falls below a first failed cell threshold value, and a second mode erase operation, which applies the different erase pass voltages to the respective memory sectors for successively increasing periods of time until the number of failed cells in each sector falls below a second failed cell threshold value.

14 Claims, 7 Drawing Sheets

NON-VOLATILE SEMICONDUCTOR MEMORY DEVICE HAVING DIFFERENT ERASE PASS VOLTAGES FOR RESPECTIVE MEMORY SECTORS AND ASSOCIATED ERASE METHOD

BACKGROUND OF THE INVENTION

1. Field of the Invention

Embodiments of the invention relate generally to non-volatile semiconductor memory devices. More particularly, embodiments of the invention relate to non-volatile semiconductor memory devices in which a plurality of memory sectors are simultaneously erased.

A claim of priority is made to Korean Patent Application No. 10-2006-46181 filed May 23, 2006, the disclosure of which is hereby incorporated by reference in its entirety.

2. Description of Related Art

In conventional non-volatile semiconductor memory devices, erase operations are typically performed on a single memory sector (i.e., a block) or a plurality of memory sectors. A typical erase operation includes an erase procedure and an erase verification procedure. In the erase procedure, a voltage difference is applied between the respective control gates and bulk region(s) of selected memory cells so that charges trapped in the respective floating gates of the selected memory cell are restored to the corresponding bulk region(s). In the erase verification procedure, data is read from the selected memory cells, and then the data is evaluated to determine whether all of the selected memory cells were successfully erased. Selected cells that were not properly erased in the erase procedure will be referred to hereafter as "failed cells". If the number of failed cells in an erased sector is greater than or equal to a failed cell threshold value, the erase procedure and the erase verification procedure are repeated on that sector.

Erase operations can be performed in multiple different modes. Moreover, sectors are often erased using multiple erase operations of different modes, carried out in succession. For example, in a first mode erase operation, the erase procedure is repeatedly performed with a successively increased bulk voltage. In a second mode erase operation, which is usually performed after the first mode erase operation, the erase procedure is repeatedly performed with the same voltages applied to control gates and the bulk region(s), but for a relatively increased time. Where a first mode erase operation is performed, the lowest bulk voltage for which the number of failed cells in a selected sector falls below the failed cell threshold value is referred to as an "erase pass voltage". The second mode erase voltage operation is usually performed on the selected sector after the first mode erase operation is performed with the "erase pass voltage" for that sector to erase remaining failed cells. By using the second mode erase operation to erase the remaining failed cells, rather than continuing to increment the bulk voltage, over erasure and non-erasure of memory cells in the selected sector is avoided.

FIG. 1 is a block diagram of a conventional non-volatile semiconductor memory device. Referring to FIG. 1, the conventional non-volatile semiconductor memory device comprises a memory cell array MCARR and associated peripheral circuits. The peripheral circuits include, for example, an erase verifier 10, a bulk voltage generator 20, a word line voltage generator 30, and a bit line voltage generator 40. These peripheral circuits are used to control various operations for storing and retrieving data from memory cell array MCARR.

Memory cell array MCARR comprises "n" memory banks BANK<1:n>, and each of memory banks BANK<1:n> comprises "m" sectors, where the "m" sectors in the i-th memory bank are labeled SEC<i:1> through SEC<i:m>. Each of the sectors comprises a plurality of non-volatile memory cells. The conventional non-volatile semiconductor memory device further comprises "n" sense amplifier blocks SA<1:n> respectively corresponding to the "n" memory banks BANK<1:n>. Sense amplifier blocks SA<1:n> sense and amplify data stored in the sectors of the corresponding memory banks BANK<1:n>.

To select a sector of memory cells for an erase operation, word line voltage generator 30 generates a word line voltage VWL and applies word line voltage VWL to word line(s) of the memory cell in a selected memory sector. In addition, bit line voltage generator 40 generates a bit line voltage VBL and applies bit line voltage VBL to bit line(s) BL of the memory cell in the selected memory sector.

Following an erase operation of one or more sectors of a selected memory bank among memory banks BANK<1:n>, a corresponding one of sense amplifier blocks SA<1:n> senses and amplifies the data stored in the one or more sectors of the selected memory bank, and provides the amplified data to erase verifier 10 through a data line DL. Erase verifier 10 receives and evaluates the data provided through data line DL and detects whether any cells in the one or more sectors of the selected memory bank failed to be erased in the erase operation.

In the non-volatile semiconductor memory device, the erase operation can be performed in such a way that memory sectors arranged in the same row of memory banks BANK<1:n> are simultaneously erased. For example, sectors SEC<1, 1>, SEC<2, 1>, . . . , SEC<n, 1> can be simultaneously erased.

Where multiple memory sectors in the same row of memory banks BANK<1:n> are simultaneously erased using the first mode erase operation, the different sectors may exhibit different "erase pass voltages". In other words, some of the sectors may be sufficiently erased with a lower bulk voltage than other sectors.

However, in the conventional non-volatile semiconductor memory device illustrated in FIG. 1, bulk voltage generator 20 applies the same bulk voltage VSUB to the bulk regions of all sectors. Unfortunately, where the multiple sectors have different "erase pass voltages", using the same bulk voltage VSUB for multiple sectors is inefficient and can cause over-erasure, non-erasure, or excessive wear and tear in some sectors.

SUMMARY OF THE INVENTION

In recognition of at least the above problems, embodiments of the present invention provide non-volatile semiconductor memory devices in which different "erase pass voltages" are applied to the bulk regions of different memory sectors. In addition, embodiments of the invention also provide methods of erasing memory sectors using these devices.

According to one embodiment of the invention, a non-volatile semiconductor memory device comprises a memory array comprising a plurality of memory sectors, wherein each memory sector has a separate bulk region. The device further comprises an erase verifier adapted to evaluate data stored in the memory sectors of the memory array and generate an erase verification signal. When the erase verifier evaluates the data stored in any one of the memory sectors, the logic state of the erase verification signal depends on the number of failed cells in the one memory sector. The device still further comprises a plurality of bank voltage controllers corresponding to the respective memory sectors. Each of the bank voltage controllers is adapted to provide a bank voltage to the bulk region of a corresponding one of the memory sectors. The bank voltage has a level that is sequentially controlled in response to the erase verification signal such that an erase pass voltage can be separately determined for each of the memory sectors in relation to the corresponding bank voltages and the erase verification signal.

According to another embodiment of the invention, a method of erasing data in a non-volatile semiconductor memory device comprising a plurality of memory sectors having separate bulk regions is provided. The method comprises performing a first mode erase operation comprising successively increasing bank voltages applied to the respective bulk regions of the memory sectors to erase data stored in the memory sectors and determining different erase pass voltages for the respective memory sectors. The method further comprises performing a second mode erase operation comprising applying the different erase pass voltages to the respective memory sectors for successively increased periods of time to erase data stored in the memory sectors.

BRIEF DESCRIPTION OF THE DRAWINGS

Embodiments of the invention are described in relation to the accompanying drawings. Throughout the drawings like reference numbers indicate like exemplary elements, components, and steps. In the drawings.

DESCRIPTION OF EXEMPLARY EMBODIMENTS

Exemplary embodiments of the invention are described below with reference to the corresponding drawings. These embodiments are presented as teaching examples. The actual scope of the invention is defined by the claims that follow.

Figure 1:
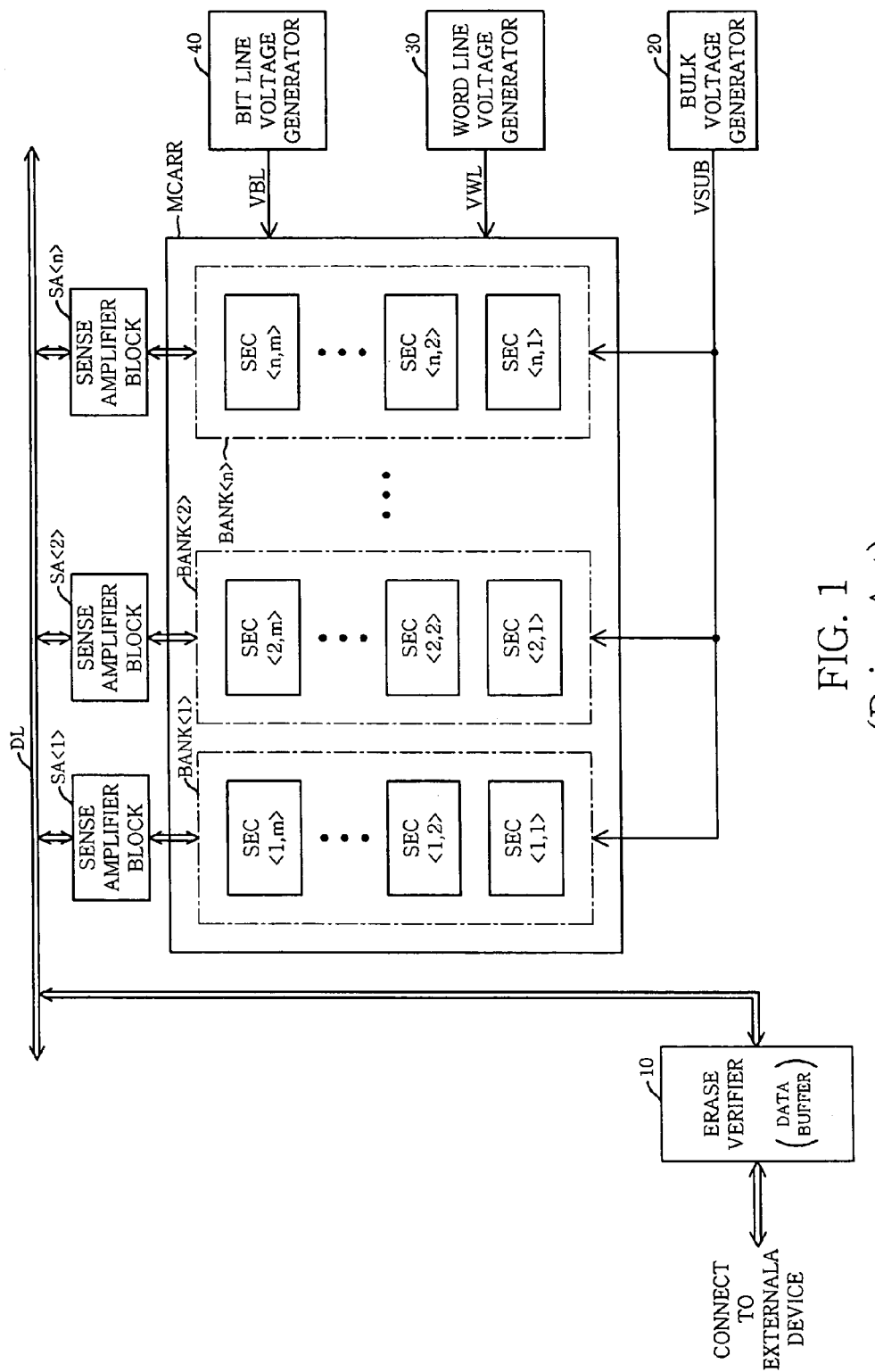
FIG. 1 is a block diagram of a conventional non-volatile semiconductor memory device.
Figure 2:
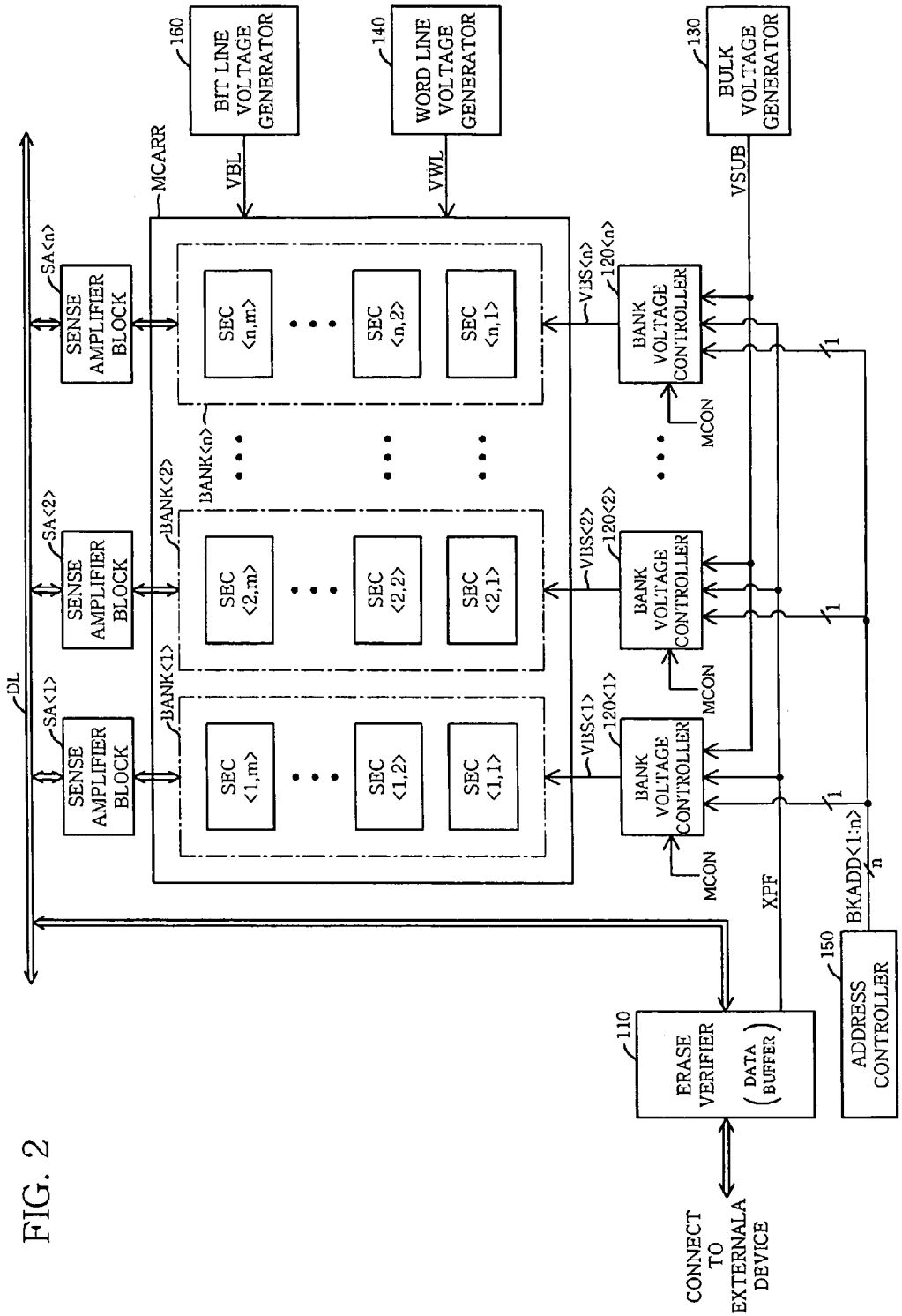
FIG. 2 is a block diagram of a non-volatile semiconductor memory device according to an embodiment of the present invention.

FIG. 2 is a block diagram of a non-volatile semiconductor memory device according to one embodiment of the present invention. Referring to FIG. 2, the non-volatile semiconductor memory device comprises a memory cell array MCARR, an erase verifier 110 and bank voltage controllers 120<1:n>.

Memory cell array MCARR comprises "n" memory banks BANK<1:n>, and each of memory banks BANK<1: n> comprises "m" sectors, where the "m" sectors in the i-th memory bank are labeled SEC<i:1> through SEC<i:m>. Each of the sectors comprises a plurality of non-volatile memory cells. The non-volatile semiconductor memory device further comprises "n" sense amplifier blocks SA<1: n> respectively corresponding to the "n" memory banks BANK<1:n>. Sense amplifier blocks SA<1:n> sense and amplify data stored in the sectors of the corresponding memory banks BANK<1:n>.

Sectors included in the same memory bank are all connected to the same bulk region. For example, memory sectors SEC<1, 1> through SEC<1, m> arranged in bank BANK<1> are all connected to a single bulk region. However, sectors included in different memory banks are connected to different bulk regions. For example, memory sectors SEC<1, 1> through SEC<1, m> are connected to a different bulk region from memory sectors SEC<n, 1> through SEC<n, m>. Because sectors in different memory banks are connected to different bulk regions, the memory sectors included in different memory banks can be supplied with different bulk voltages.

Data stored in memory banks BANK<1:n> is sensed and amplified by sense amplifiers in respective sense amplifier blocks SA<1:n>, and the amplified data is provided to data line DL. For example, data stored in memory sectors SEC<1, 1> through SEC<1, m> included in memory bank BANK<1> is sensed and amplified by sense amplifiers in a sense amplifier block SA<1> and the amplified data is provided to data line DL. Similarly, data stored in memory sectors SEC<n, 1> through SEC<n, m> included in memory bank BANK<n> is sensed and amplified by sense amplifiers in a sense amplifier block SA<1> and the amplified data is provided to data line DL.

Memory sectors in the same row can be simultaneously selected and erased during an erase operation. For example, memory sectors SEC<1, 1>, SEC<2, 1>, . . . , SEC<n, 1> can be simultaneously selected and erased during an erase operation. In this case, corresponding bank voltages VBS<1> through VBS<n> are supplied to the bulk regions of memory banks BANK<1> through BANK<n>, which include the respective memory sectors SEC<1, 1>, SEC<2, 1>, . . . , SEC<n,1>. Bank voltages VBS<1> through VBS<n> are provided by respective bank voltage controllers 120<1> through 120<n>.

Erase verifier 110 examines data stored in memory cell array MCARR and provided through data line DL during an erase verification procedure. Typically, the erase verification procedure is performed by selectively enabling one of a plurality of sense amplifier blocks SA<1:n> and then transmitting data from the memory bank corresponding to the enabled sense amplifier block to data line DL. In other words, even where a row of sectors is simultaneously erased in an erase procedure, the corresponding erase verification procedure is still generally performed one sector at a time. Preferably, the one of sense amplifier blocks SA<1:n> is selectively enabled according to a bank address BKADD<1: n> provided by an address controller 150.

Erase verifier 110 typically examines data from a single selected memory sector. Erase verifier 110 generates an erase verification signal XPF with a logic state based on whether the single selected memory sector has been successfully erased. In other words, the logic state of erase verification signal XPF is controlled by the number of failed cells in the selected memory sector. As an example, in one embodiment, erase verification signal XPF is temporarily generated with a logic state "H" (e.g., as a pulse) where the number of failed cells in the selected memory sector is greater than or equal to a failed cell threshold value. For explanation purposes, a signal with logic state "H" will be termed "activated". On the other hand, erase verification signal XPF is maintained in a logic state "L" where the number of failed cells in the selected memory sector is less than the failed cell threshold value. For explanation purposes, a signal with logic state "L" will be termed "deactivated".

The voltage levels of bank voltages VBS<1> through VBS<n> are preferably sequentially controlled in response to the erase verification signal XPF. For example, the voltage levels of bank voltages VBS<1> through VBS<n> may be gradually increased in response to the activation of erase verification signal XPF where a mode control signal MCON is activated to logic state "H". Mode control signal MCON is a signal used to indicate a mode used to perform an erase operation on the non-volatile semiconductor memory device. Where mode control signal MCON is activated, bank voltage controllers 120<1> through 120<n> are driven to verify their "erase pass voltages". In other words, where mode control signal MCON is activated, a first mode erase operation is performed. On the other hand, where mode control signal MCON is deactivated, a second mode erase operation is performed.

The term "erase pass voltage" denotes the lowest level for each of bank voltages VBS<1> through VBS<n> for which erase verification signal XPF indicates that the number of failed cells in a corresponding memory sector is below the failed cell threshold value. More specifically, the "erase pass voltage" for a given sector is the lowest level of the corresponding bank voltage for which erase verification signal XPF indicates that the number of failed cells in the sector is below the failed cell threshold value.

Where a simultaneous erase operation is performed for multiple sectors in different banks of memory cell array MCARR, erase pass voltages with different levels are typically generated for the respective sectors in response to erase verification signal XPF. The erase pass voltages having different levels are then stored in corresponding bank voltage controllers 120<1> through 120<n>.

Variation in the levels of bank voltages VBS<1> through VBS<n>, obtained as erase pass voltages in response to the activation of erase verification signal XPF, is described below.

Mode control signal MCON is activated during a first mode erase operation. During the erase verification procedure of the first mode erase operation, where the number of failed cells detected in a selected sector is greater than or equal to the failed cell threshold value and erase verification signal XPF is activated, the level of the bank voltage corresponding to the selected sector is increased and the first mode erase operation is repeated.

Mode control signal MCON is deactivated during a second mode erase operation. In the second mode erase operation, erase verification signal XPF is activated independent of the number of failed cells in the selected sector. The voltage level of the bank voltage for the sector is maintained at the "erase pass voltage" of the selected sector. In other words, the bulk voltage of the selected sector is maintained at the sector's "erase pass voltage".

Accordingly, in a non-volatile semiconductor memory device according to selected embodiments of the invention, different sectors of memory cell array MCARR have different "erase pass voltages". The different "erase pass voltages" are ascertained in a first mode erase operation. The different "erase pass voltages" for the different memory sectors are then applied to the bulk regions of corresponding memory sectors in a second mode erase operation.

By using "erase pass voltages" determined by the first mode erase operation, bulk voltages having suitable levels are applied to respective memory sectors in the second mode erase operation, which can prevent over-erasure and non-erasure of memory cells.

Preferably, the non-volatile semiconductor memory device further includes a main voltage generator 130. Main voltage generator 130 pumps external power, such as a supply voltage VCC, and generates a main voltage VBM. Main voltage VBM is preferably maintained at a voltage level higher than the external power. In addition, bank voltage controllers 120<1> through 120<n> generate bank voltages VBS<1> through VBS<n>, respectively, by dropping main voltage VBM.

The non-volatile semiconductor memory device preferably further comprises an address controller 150. Address controller 150 generates a bank address BKADD corresponding to a selected memory sector from which data is to be erased in memory cell array MCARR. In other words, bank address BKADD corresponds to the memory sector to be erased. Bank voltage controllers 120<1> through 120<n> generate their respective bank voltages VBS<1> through VBS<n> in response to bank address BKADD. Further, as described above, bank voltages VBS<1> through VBS<n> are provided to corresponding memory sectors, in respective memory banks BANK<1> through BANK<n>.

In the device of FIG. 2, a word line voltage generator 140 generates a word line voltage VWL, which is applied to word line(s) of memory cells in the selected memory sector. A bit line voltage generator 160 generates a bit line voltage VBL, which is applied to bit line(s) BL of the memory cells in the selected memory sector.

Erase verifier 110 of FIG. 2 can be implemented to connect to an external device, and to function as a data buffer to buffer data on data line DL for the external device. Erase verifier 110 can be implemented using a variety of techniques known to those skilled in the art, and therefore a detailed description thereof is omitted.

Figure 3:
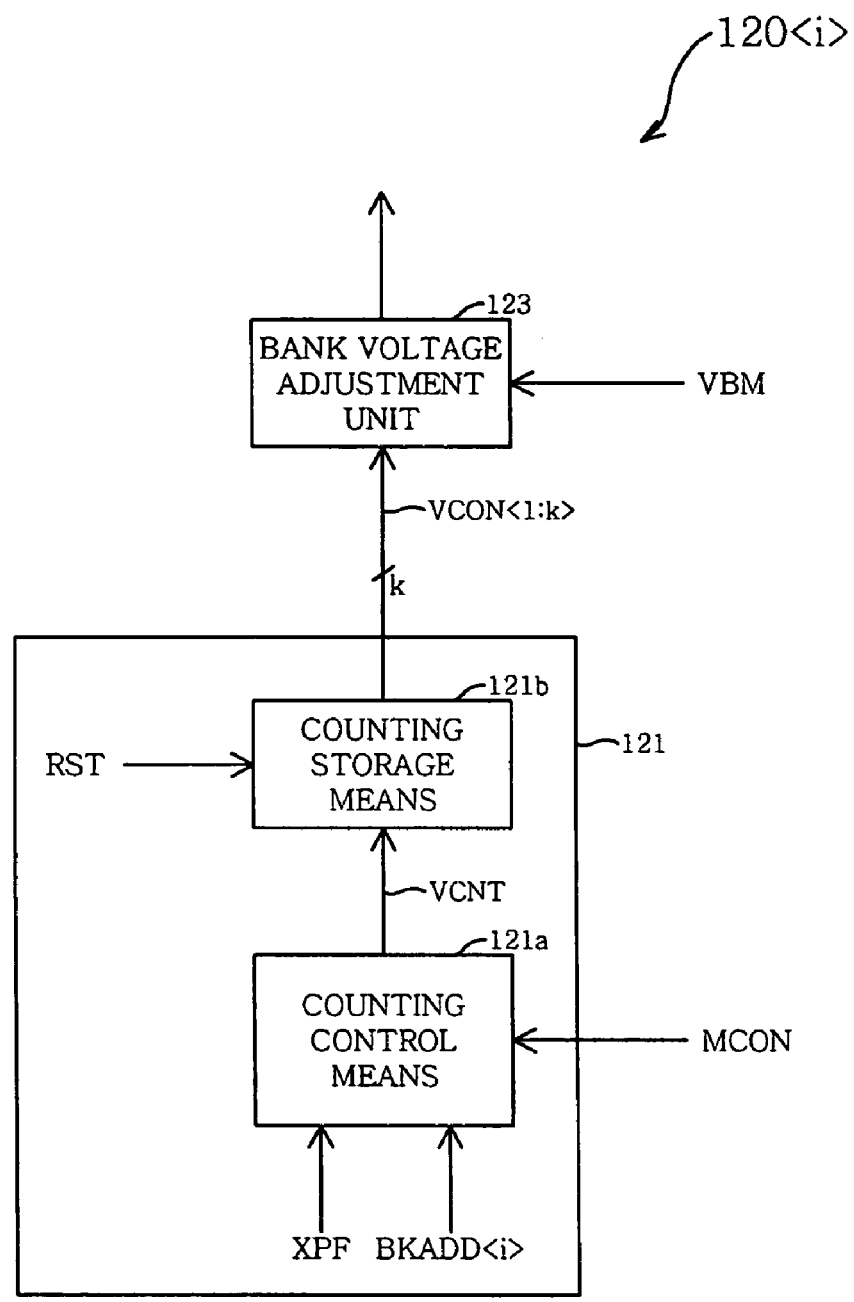
FIG. 3 is a diagram of a bank voltage controller illustrated in FIG. 2.

FIG. 3 is a diagram showing one of bank voltage controllers 120<1:n> shown in FIG. 2. The bank voltage controller in FIG. 3 will be generically referred to as bank voltage controller 120<i>. However, each of bank voltage controllers 120<1:n> can be implemented similar to bank voltage controller 120<i>.

Referring to FIG. 3, bank voltage controller 120<i> comprises a control signal generation unit 121 and a bank voltage adjustment unit 123. Control signal generation unit 121 is enabled when a bank address BKADD<i> for selecting a corresponding memory sector in a corresponding memory bank is activated in response to the activation of mode control signal MCON. Under these conditions, a voltage control signal group VCON<1:k>, which is generated by control signal generation unit 121, is controlled in response to erase verification signal XPF. More specifically, voltage control signal group VCON<1:k> is controlled in the form of a sequential combination when erase verification signal XPF has a logic state indicating an "erase verification failure" for a corresponding memory sector. In other words, signals constituting voltage control signal group VCON<1:k> are sequentially activated in response to erase verification signal XPF to indicate an "erase verification failure" for a corresponding memory sector.

Meanwhile, voltage control signal group VCON<1:k> is maintained in a constant state during the erase operation performed in the second mode, where mode control signal MCON is deactivated.

Control signal generation unit 121 includes a counting control unit 121a and a counting storage unit 121b. Counting control unit 121a is enabled in response to the activation of bank address BKADD<i>, which is generated after mode control signal MCON has been activated.

Counting control unit 121*a* generates a counting signal VCNT that is activated in response to the activation of erase verification signal XPF, which indicates "erase verification failure". After a corresponding bank address BKADD<i> has been activated to logic state "H", counting signal VCNT is also activated to logic state "H" in response to the activation of erase verification signal XPF with logic state "H".

Counting storage unit 121*b* generates voltage control signal group VCON<1:k>, which responds to the activation of counting signal VCNT. The signals constituting voltage control signal group VCON<1:k> are sequentially activated in response to the activation of counting signal VCNT. In addition, counting storage unit 121*b* stores the logic stage of voltage control signal group VCON<1:k> and maintains the logic state of voltage control signal group VCON<1:k>, as verified in the first mode erase operation, during the second mode erase operation.

Preferably, counting storage unit 121*b* resets voltage control signal group VCON<1:k> through its initial state in response to a reset signal RST.

Bank voltage adjustment unit 123 generates bank voltage VBS<i> corresponding to voltage control signal group VCON<1:k>. For example, the level of bank voltage VBS<i> is also increased in response to an activated signal of voltage control signal group VCON<1:k>. Preferably, bank voltage adjustment unit 123 generates bank voltage VBS by dropping main voltage VBM.

Figure 4:
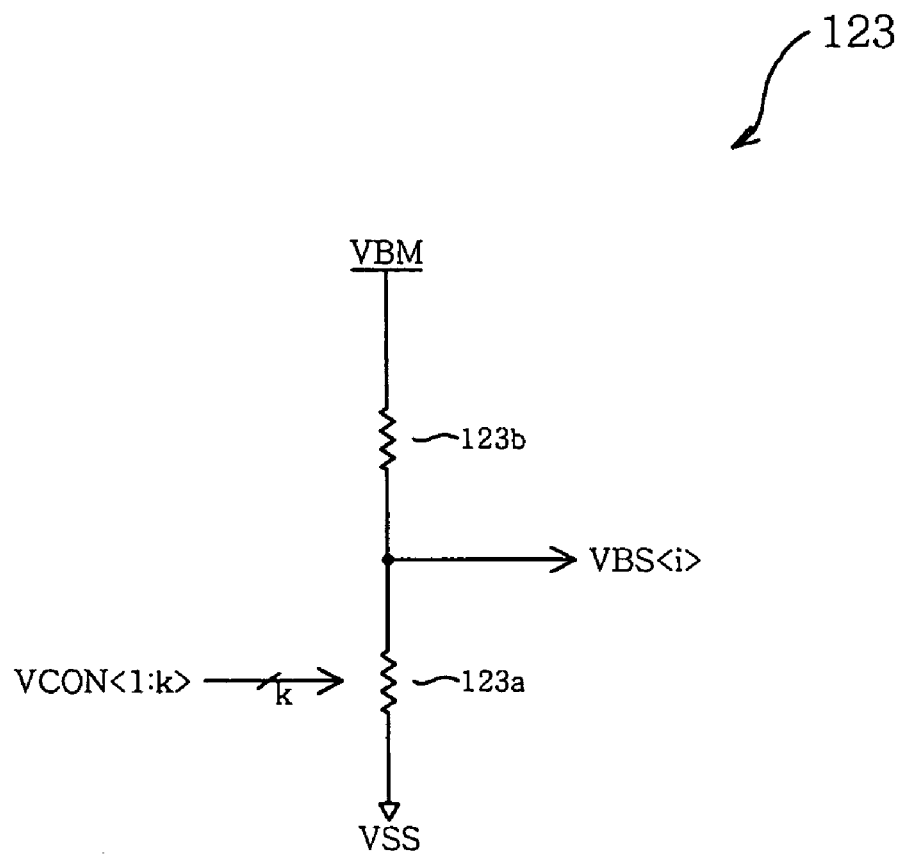
FIG. 4 is a diagram of a bank voltage adjustment unit illustrated in FIG. 3.

FIG. 4 is a diagram showing an example of bank voltage adjustment unit 123 of FIG. 3. Referring to FIG. 4, bank voltage adjustment unit 123 includes a first resistor 123*a* and a second resistor 123*b*. In this case, bank voltage VBS<i> is formed by dividing main voltage VMB by the ratio of the resistances of first resistor 123*a* and second resistor 123*b*. Preferably, the resistance of first resistor 123*a* is variable, and the resistance of second resistor 123*b* is fixed. In this case, the level of bank voltage VBS<i> is controlled in response to an activated signal from among voltage control signal group VCON<1:k>.

Figure 5:
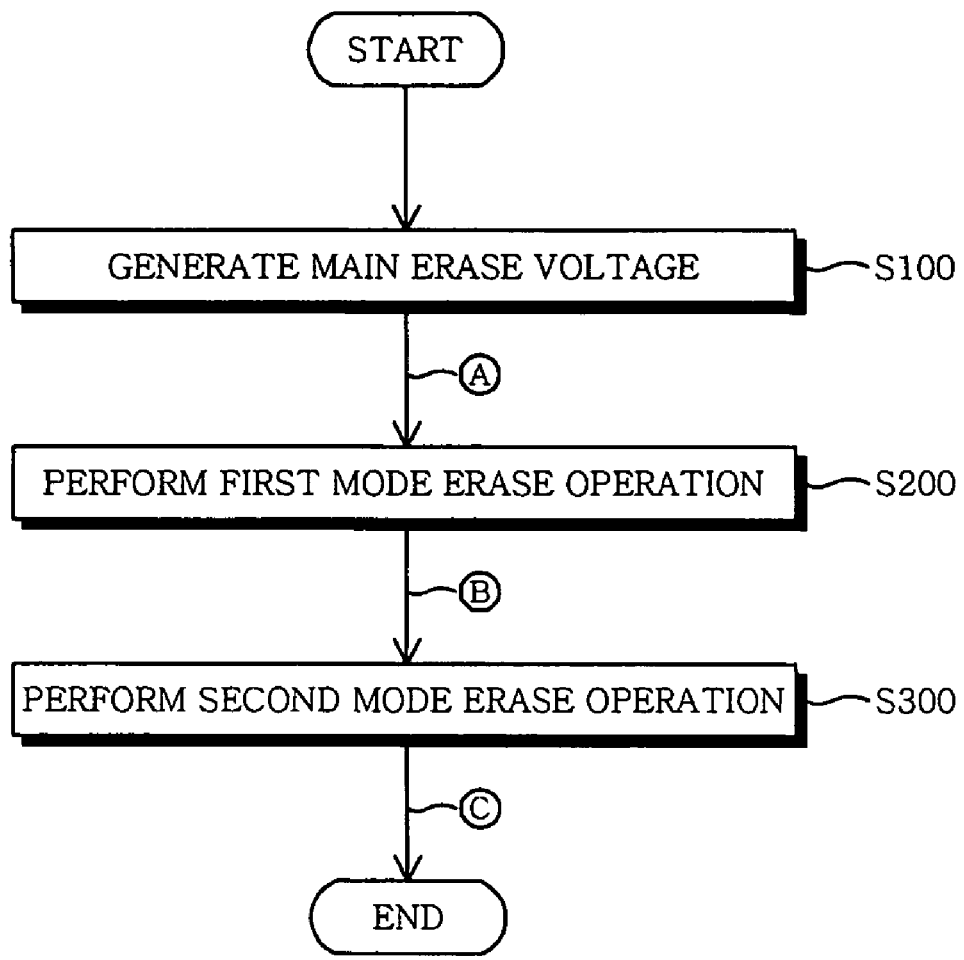
FIG. 5 is a flowchart illustrating a data erasing method for a non-volatile semiconductor memory device according to an embodiment of the present invention.

FIG. 5 is a flowchart of a data erasing method for a non-volatile semiconductor memory device according to an embodiment of the present invention. Referring to FIGS. 2 and 5, the data erasing method comprises a main erase voltage generation step S100, a first mode erase operation step S200 and a second mode erase operation step S300.

In main erase voltage generation step S100, main voltage VBM is generated by the pumping of external power, such as supply voltage VCC.

In first mode erase operation step S200, a first mode erase operation is performed to erase data stored in selected memory sectors SEC<1, 1> through SEC<n,1>. In this case, the levels of bank voltages VBS<1> through VBS<n> supplied to corresponding memory sectors SEC<1, 1> through SEC<n, 1> are gradually increased in response to erase verification signal XPF indicating an "erase verification failure", where a number of failed cells is detected to be greater than or equal to a failed cell threshold value. In this case, bank voltages VBS<1> through VBS<n> of memory sectors SEC<1, 1> through SEC<n,1> are generated by dropping main voltage VBM.

In first mode erase operation step S200, "erase pass voltages" are verified and stored. As described above, the term "erase pass voltages" denotes initial levels of bank voltages VBS<1> through VBS<n> indicating "erase verification pass" where a number of failed cells in a sector is less than the failed cell threshold value. As described above, memory sectors SEC<1, 1> through SEC<n, 1> may have different "erase pass voltages".

In second mode erase operation step S300, a second mode erase operation is performed to erase data stored in selected memory sectors SEC<1, 1> through SEC<n, 1>. In other words, in second mode erase operation step S300, respective "erase pass voltages" of memory sectors SEC<1,1> through SEC<n,1>, verified in first mode erase operation step S200, are applied. Further, as "erase verification failure" is verified in corresponding memory sectors SEC<1, 1> through SEC<n, 1>, the time for which each of the "erase pass voltages" is applied gradually increases.

Figure 6:
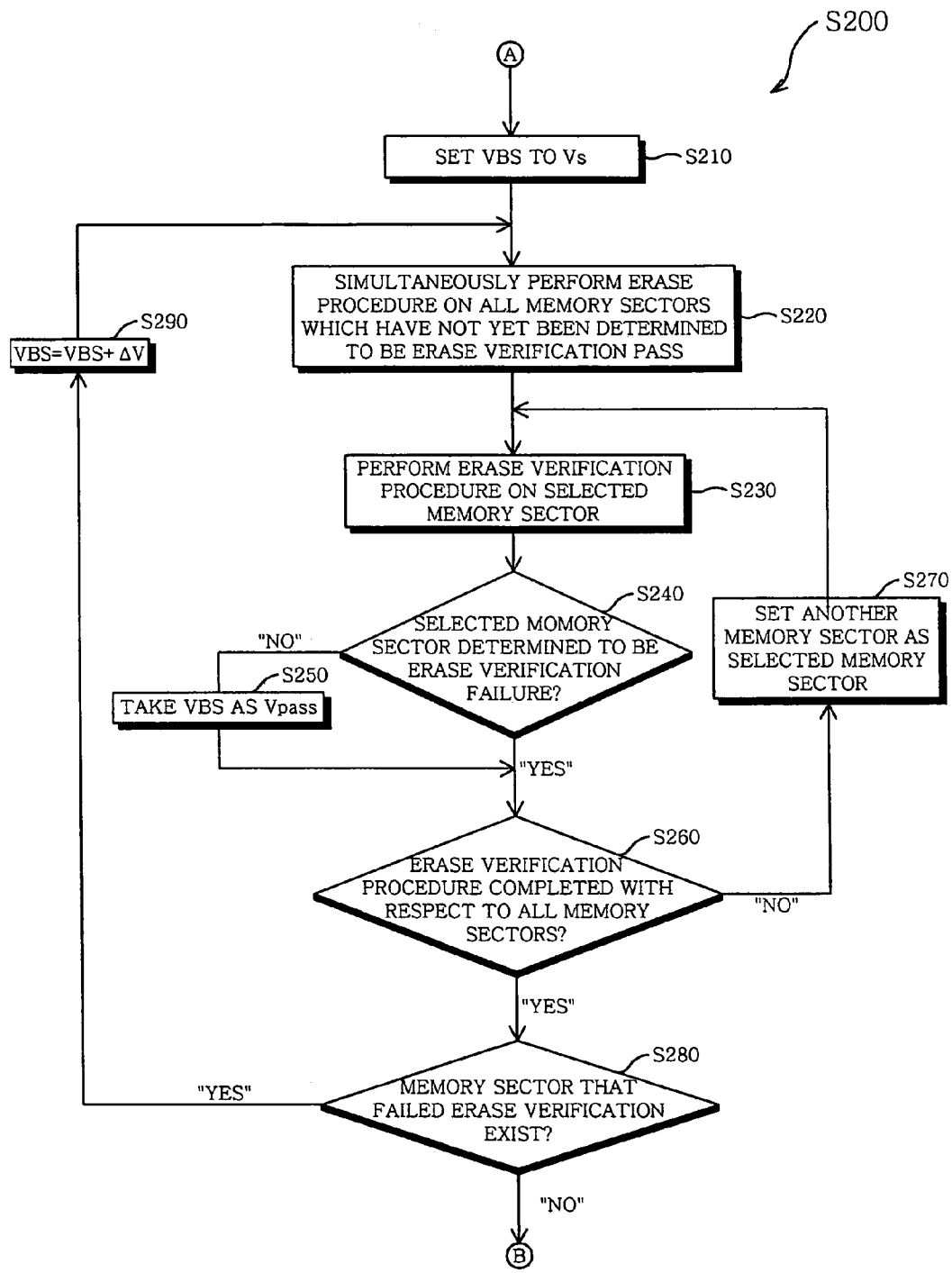
FIG. 6 is a flowchart illustrating a first mode erase operation shown in the method of FIG. 5; and, FIG. 7 is a flowchart illustrating a second mode erase operation shown in the method of FIG. 5.

FIG. 6 is a flowchart illustrating first mode erase operation step S200 of FIG. 5 in further detail. Referring to FIG. 6, in a step S210, bank voltage VBS is set to an initial voltage Vs. Next, in a step S220, bank voltage VBS is simultaneously applied to the bulk regions of all of memory sectors SEC<1, 1> through SEC<n, 1>, which have not yet been determined to be "erase verification pass". The erase procedure is performed on those sectors by forming a voltage difference between the control gates and the bulk regions of memory cells in those memory sectors SEC<1, 1> through SEC<n, 1> using bank voltage VBS. Next, in a step S230, the erase verification procedure is performed to verify failed cells for a selected one of the memory sectors.

Next, a step S240 determines whether the number of failed cells in the selected memory sector is greater than or equal to the failed cell threshold value. Where step S240 determines that the number of failed cells for is less than the failed cell threshold value, i.e., "erase verification pass" has occurred, a step S250 is performed. In step S250, bank voltage VBS is taken as the "erase pass voltage Vpass" of the selected memory sector.

Where step S240 determines that the number of failed cells in the selected memory sector is greater than or equal to the failed cell threshold value, i.e., an "erase verification failure" has occurred, step S260 is performed. Step S260 determines whether the erase verification procedure has been completed with respect to all memory sectors for which the erase procedure has been performed. Where step S260 determines that the erase verification procedure has not been performed for at least one of those memory sectors, a step S270 is performed. In step S270, a memory sector for which the erase verification procedure has not yet been performed is set as the selected memory sector. Step 200 is then performed on the newly selected memory sector beginning with step S230.

Where step S260 determines that the erase verification procedure has been performed for all memory sectors, a step S280 is performed. Step S280 determines whether any of the memory sectors for which the erase procedure was performed has failed erase verification.

Where step S280 determines that some memory sector failed erase verification, a step S290 is performed. In step S290, bank voltage VBS is increased by an increment Δ V. Thereafter, step 200 is repeated starting from step S220. However, where step S280 determines that no memory sector failed erase verification, second-mode erase operation step S300 of FIG. 5 is performed.

As described above, in first mode erase operation step S200 illustrated in FIG. 6, different "erase pass voltages" can be set for respective memory sectors.

Figure 7:
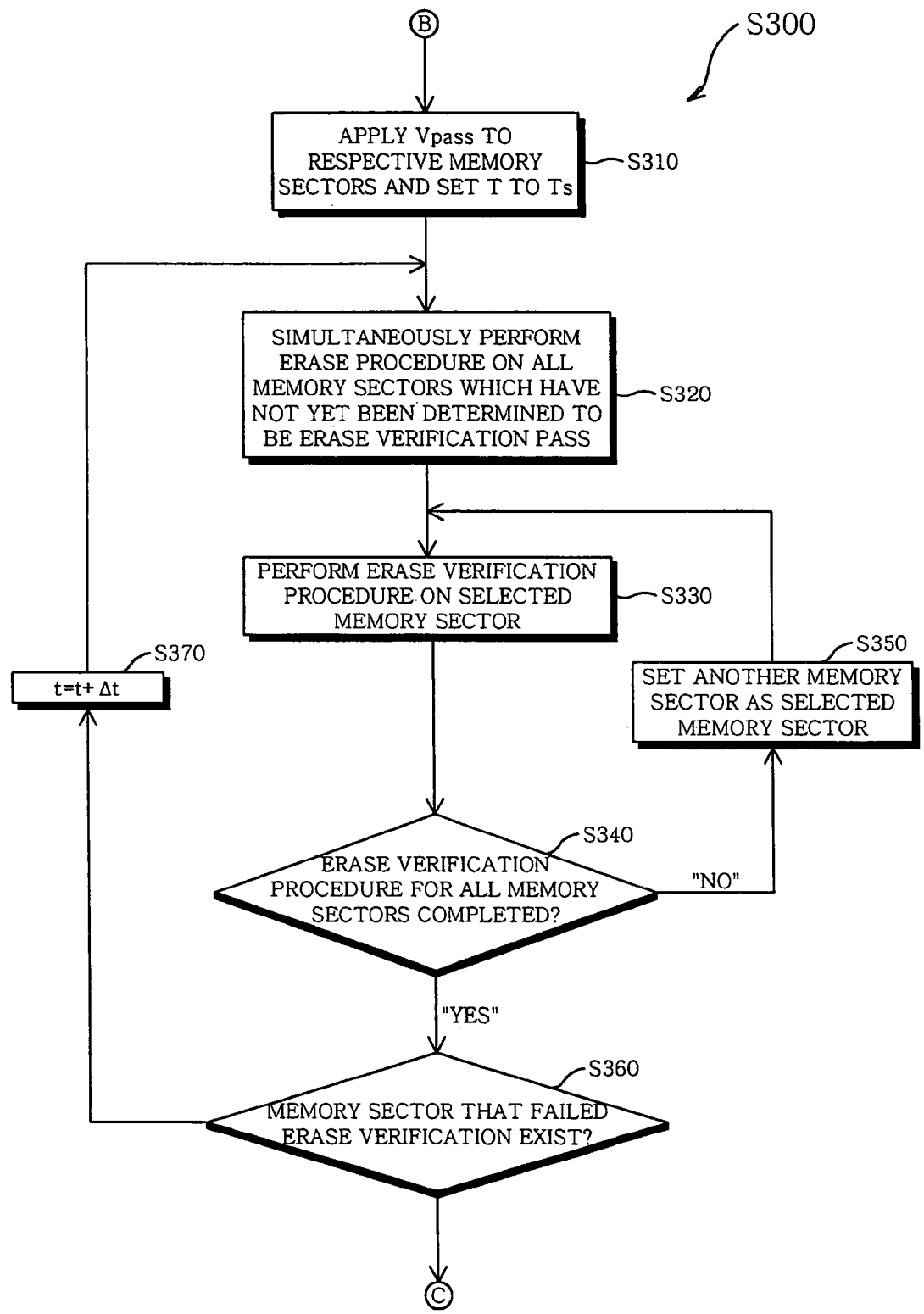

FIG. 7 is a flowchart illustrating second mode erase operation step S300 of FIG. 5 in further detail. Referring to FIG. 7, in step S310, an application period "T" is set as 'initial application period "Ts", and corresponding "erase pass voltages" are applied to the bulk regions of the respective memory sectors. In step S320, an erase procedure is simultaneously performed on all memory sectors SEC<1, 1> through SEC<n, 1> that have not yet been determined to be "erase verification pass". In the erase procedure, the "erase pass voltages" are applied to the bulk regions of corresponding memory sectors for an application period. Then, in a step S330, an erase verification is performed to verify failed cells in selected memory sectors.

Next, a step S340 determines whether the erase verification procedure has been completed with respect to all memory sectors for which the erase procedure has been performed.

Where step S340 determines that the erase verification procedure has not yet been completed for some memory sector, a step S350 is performed. In step S350, the memory sector for which the erase verification procedure has not yet been completed is set as a selected memory sector. Thereafter, step 300 is repeated, starting from step S330.

On the other hand, where step S340 determines that the erase verification procedure has been completed for all memory sectors, a step S360 is performed. Step S360 determines whether any memory sector has failed erase verification.

Where step S360 determines that a memory sector has failed erase verification, a step S370 is performed. Step S370 increments the application period "t" by an increment Δ t. Thereafter, step 300 is repeated, beginning from S320.

Where step S360 determines that no memory sector failed erase verification, the erase operation for the non-volatile semiconductor memory device is terminated.

It should be noted that the failed cell threshold value used for the first mode erase operation may be different from the failed cell threshold value used for the second mode erase operation. For instance, to obtain "erase verification pass" for a sector in the second mode erase operation, fewer failed cells may be allowed than in the first mode erase operation.

The above-described non-volatile semiconductor memory device and erase operation are generally implemented so that different "erase pass voltages" can be determined for different memory sectors in the first mode erase operation. Then, in the second mode erase operation, the "erase pass voltages" determined in the first mode erase operation are applied to the bulk regions of the respective memory sectors, thus efficiently preventing over-erasure or non-erasure of memory cells.

The foregoing exemplary embodiments are teaching examples. Those of ordinary skill in the art will understand that various changes in form and details may be made to the exemplary embodiments without departing from the scope of the invention.

What is claimed:

1. A non-volatile semiconductor memory device, comprising:
    a memory array comprising a plurality of memory sectors, wherein each memory sector has a separate bulk region;
    an erase verifier adapted to evaluate data stored in the memory sectors of the memory array and generate an erase verification signal, wherein when the erase verifier evaluates the data stored in any one of the memory sectors, the logic state of the erase verification signal depends on the number of failed cells in the one memory sector; and,
    a plurality of bank voltage controllers corresponding to the respective memory sectors, wherein each of the bank voltage controllers is adapted to provide a bank voltage with a level that is sequentially controlled in response to the erase verification signal, to the bulk region of a corresponding one of the memory sectors, such that an erase pass voltage can be separately determined for each of the memory sectors in relation to the corresponding bank voltages and the erase verification signal.

2. The non-volatile semiconductor memory device of claim 1, further comprising a main voltage generator adapted to generate a main voltage;
    wherein the bank voltage controllers generate their respective bank voltages by dropping the main voltage.

3. The non-volatile semiconductor memory device of claim 2, further comprising an address controller adapted to generate a bank address corresponding to a selected memory sector among the plurality of memory sectors;
    wherein each of the bank voltage controllers generates the bank voltage in response to the bank address and provides the bank voltage to a corresponding memory sector.

4. The non-volatile semiconductor memory device of claim 3, wherein each of the bank voltage controllers comprises:
    a control signal generation unit enabled in response to the bank address and adapted to generate a voltage control signal group in response to the erase verification signal indicating an erase verification failure in the selected memory sector; and,
    a bank voltage adjustment unit adapted to generate the bank voltage with a level determined by an activated signal in the voltage control signal group.

5. The non-volatile semiconductor memory device of claim 4, wherein the bank voltage adjustment unit generates the bank voltage by dropping the main voltage.

6. The non-volatile semiconductor memory device of claim 4, wherein the control signal generation unit comprises:
    a counting control unit enabled in response to the bank address and adapted to generate a counting signal as a pulse in response to the erase verification signal indicating an erase verification failure in the selected memory sector; and,
    a counting storage unit adapted to generate the voltage control signal group in response to the counting signal.

7. The non-volatile semiconductor memory device of claim 6, wherein the counting storage unit stores a logic state of the voltage control signal group.

8. The non-volatile semiconductor memory device of claim 6, wherein the counting storage unit is reset to an initial state in response to a reset signal.

9. The non-volatile semiconductor memory device of claim 1, wherein the erase verification signal is activated as a pulse when the number of failed cells in a selected memory sector among the plurality of memory sectors is greater than or equal to the first failed cell threshold value.

10. The non-volatile semiconductor memory device of claim 9, wherein the erase verification signal is maintained in deactivated state when the number of failed cells in the selected memory sector is less than the first failed cell threshold value.

11. A method of erasing data in a non-volatile semiconductor memory device comprising a plurality of memory sectors having separate bulk regions, the method comprising:
    performing a first mode erase operation comprising successively increasing bank voltages applied to the respective bulk regions of the memory sectors to erase data stored in the memory sectors and determining different erase pass voltages for the respective memory sectors; and, performing a second mode erase operation comprising applying the different erase pass voltages to the respective memory sectors for successively increased periods of time to erase data stored in the memory sectors.

12. The method of claim 11, further comprising:
generating a main voltage; and,
dropping the main voltage to generate the bank voltages.

13. The method of claim 11, wherein determining the different erase pass voltages for the respective memory sectors comprises activating an erase verification signal when a number of failed cells in a selected memory sector falls below a failed cell threshold value.

14. The method of claim 11, wherein the second mode erase operation further comprises:
determining whether a number of failed cells in a selected memory sector falls below a failed cell threshold value.

* * * * *